United States Patent
Aref Mahmoud (10) Patent No.: US 12,009,796 B2
(45) Date of Patent: Jun. 11, 2024

(54) HIGH-ORDER PASSIVE FILTER WITH CAPACITIVE INNER TAPPING TECHNIQUE

(71) Applicant: Apple Inc., Cupertino, CA (US)

(72) Inventor: Ahmed F. Aref Mahmoud, Munich (DE)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/461,303

(22) Filed: Sep. 5, 2023

(65) Prior Publication Data

US 2024/0063769 A1    Feb. 22, 2024

Related U.S. Application Data (63) Continuation of application No. 17/659,759, filed on Apr. 19, 2022, now Pat. No. 11,791,792.

(51) Int. Cl.
| | | |
|---|---|---|
| H03H 7/01 | (2006.01) | |
| H01F 21/12 | (2006.01) | |
| H03H 7/09 | (2006.01) | |
| H03H 7/42 | (2006.01) | |

(52) U.S. Cl.
CPC ............ H03H 7/0115 (2013.01); H01F 21/12 (2013.01); H03H 7/0153 (2013.01); H03H 7/175 (2013.01); H03H 7/425 (2013.01)

(58) Field of Classification Search
CPC ......... H03H 7/0115; H03H 7/09; H03H 7/425
USPC .................. 333/175, 177, 181, 185
See application file for complete search history.

(56) References Cited

U.S. PATENT DOCUMENTS

| | | | |
|---|---|---|---|
| 5,200,703 A | 4/1993 | Popp et al. | |
| 9,172,353 B2 | 10/2015 | Pye et al. | |
| 10,250,065 B2 | 4/2019 | Chou | |
| 10,855,253 B2 | 12/2020 | Bagga et al. | |
| 10,951,190 B2 | 3/2021 | Atalla et al. | |
| 2011/0169586 A1 | 7/2011 | Taniguchi | |
| 2014/0266506 A1 | 9/2014 | Andersson et al. | |

FOREIGN PATENT DOCUMENTS

| | | |
|---|---|---|
| CN | 210693461 U | 6/2020 |
| CN | 112994649 A | 6/2021 |
| KR | 10-2061066 B1 | 2/2020 |
| KR | 10-2075284 B1 | 2/2020 |

OTHER PUBLICATIONS

International Search Report and Written Opinion in PCT Appl. No. PCT/US2023/065724 mailed Jul. 28, 2023, 8 pages.

*Primary Examiner* — Rakesh B Patel (74) *Attorney, Agent, or Firm* — Kowert, Hood, Munyon, Rankin & Goetzel, P.C.; Dean M. Munyon (57) ABSTRACT

A high-order filter with a capacitive inner tapping technique is disclosed. The filter includes an inductor and a first resonant circuit including a first portion of the inductor and a first capacitor. The first resonant circuit is configured to attenuate first frequency components of an input signal above a cutoff frequency to generate a filtered signal. The filter further includes a second resonant circuit coupled in parallel with the first resonant circuit and including the first portion of the inductor and a second capacitor. The second resonant circuit is configured to attenuate the first frequency components of the input signal to generate the filtered signal. A third resonant circuit includes a second portion of the inductor and a third capacitor, wherein the third resonant circuit is configured to attenuate second frequency components of the filtered signal above the cutoff frequency to generate an output signal.

20 Claims, 8 Drawing Sheets

HIGH-ORDER PASSIVE FILTER WITH CAPACITIVE INNER TAPPING TECHNIQUE

PRIORITY CLAIM

The present application is a continuation of U.S. application Ser. No. 17/659,759, entitled "High-Order Passive Filter with Capacitive Inner Tapping Technique," filed Apr. 19, 2022, the disclosure of which is incorporated by reference herein in its entirety.

BACKGROUND

Technical Field

This disclosure is directed to electrical/electronic circuits, and more particularly, to passive filter circuits.

Description of the Related Art

Filters are widely used in a wide variety of electronic circuits. Filters can be divided into active filters and passive filters, as well as being divided into analog filters and digital filters. Active filters include one or more active components (e.g., transistors), while passive filters are implemented using passive components such as inductors and capacitors. Digital filters typically include a number of delay units and corresponding taps. Analog filters may be implemented in a wide variety of arrangements of passive components.

Filters can also be defined by an order. For example, the order of a digital filter can be defined by a number of delay elements used therein. The order of an analog filter is defined by the number of poles in its transfer function. Higher order filters typically provide a higher rejection outside of the passband of the filter. For example, a first order filter provides approximately 6 decibels (dB) of rejection per octave outside of its passband. A fifth order filter provides approximately 30 dB of rejection per octave outside of its passband. Accordingly, the order of a filter may be adjusted in accordance with the desired amount of rejection.

SUMMARY

A high-order filter with a capacitive inner tapping technique is disclosed. In one embodiment, a filter includes an inductor and a first resonant circuit including a first portion of the inductor and a first capacitor. The first resonant circuit is configured to attenuate first frequency components of an input signal above a cutoff frequency to generate a filtered signal. The filter further includes a second resonant circuit coupled in parallel with the first resonant circuit and including the first portion of the inductor and a second capacitor. The second resonant circuit is configured to attenuate the first frequency components of the input signal to generate the filtered signal. A third resonant circuit includes a second portion of the inductor and a third capacitor, wherein the third resonant circuit is configured to attenuate second frequency components of the filtered signal above the cutoff frequency to generate an output signal.

BRIEF DESCRIPTION OF THE DRAWINGS

The following detailed description makes reference to the accompanying drawings, which are now briefly described.

DETAILED DESCRIPTION OF EMBODIMENTS

Many analog filters that use passive components require inductors. The order of an analog filter can be defined by the number of poles in the filter transfer function. Higher order filters are often desirable due to a higher gain rolloff at the bandwidth frequencies, with the gain rolloff (attenuation) occurring at higher rates relative to lower order filters. Higher order analog filters using passive components require multiple inductors and capacitors. However, this consumes a greater amount of circuit area on a chip, particularly the inductors. Thus, there is a trade-off between filter order and area with passive analog filters.

The present disclosure makes use of the insight that a tapped-in capacitive approach can increase the effective order of a filter without increasing the inductor area. Accordingly, a center-tapped passive filter with a resonance circuit is disclosed. The circuit includes a capacitor having a first terminal coupled to an input node and a second terminal that is center-tapped in an inductor to create a resonance circuit. The structure is repeated in a differential filter that includes coupled inductors (i.e. sharing the same magnetic core). Impedance matching capacitors are provided on the input and output so that the characteristic impedances going in and coming out of the filter match. Another capacitor is coupled to the center tap (or between both center taps in a differential embodiment) to control the flatness of the response. As a result of this arrangement, the response of a higher order filter (e.g., $5^{th}$ order) with a very sharp rejection out of band may be obtained while consuming significantly less area than other filters of the same order.

The discussion below begins with a description of several different embodiments and details thereof. The embodiments include both single-ended and differential filters. A diagram of one embodiment of intertwined inductors as implemented on an integrated circuit die is then discussed. Thereafter, a system which utilizes the filter in the transmission and reception of radio signals/reflections is discussed. A method for operating a filter in accordance with the disclosure is then described, followed by discussion of an example system in which the filter may be utilized (along with the previously discussed system).

Figure 1:
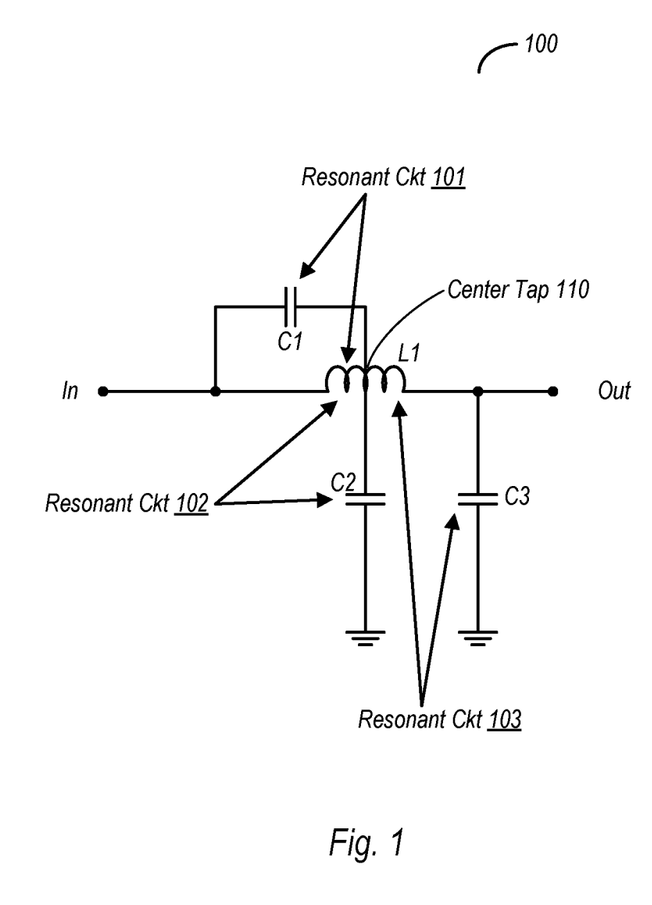
FIG. 1 is a schematic diagram of one embodiment of a filter circuit having a tapped inductor.

Filter with Capacitive Inner Tapping Technique:

FIG. 1 is a schematic diagram of one embodiment of a filter circuit having a tapped inductor. In the embodiment shown, filter 100 includes a first capacitor C1, a second capacitor C2, a third capacitor, C3, and an inductor L1. The inductor L1 in the embodiment shown includes a center tap 110, which provides center connections to each of capacitors C1 and C2. Capacitor C1 and a portion of the inductor L1 form a first resonant circuit 101 in the embodiment shown. A second resonant circuit is formed by C2 and the same portion of L1 as the first resonant circuit (left of the center tap 110). A third resonant circuit 103 is formed by another portion of inductor L1 (right of the center tap 110) and capacitor C3. It is noted that each of the capacitors in the embodiment shown may be implemented as capacitor banks, and may be subject to some tuning prior to operation.

Filter 100 is a passive filter configured to provide filtering of signals received on the input (In) above a cutoff frequency. The first resonant circuit 101 and the second resonant circuit 102 of filter 100 are configured to filter first frequency components above a cutoff frequency. The third resonant circuit 103 filters second frequency components above the cutoff frequency, with the second frequency components being of frequencies greater than the first frequency components.

Using this arrangement, filter 100 in this particular embodiment forms a fifth-order, single-ended filter. In contrast to other fifth order passive filters that utilize a two capacitor/inductor pairs, filter 100 as shown here implements the same filtering with fewer components, namely three capacitors and a single inductor. Using this configuration, the filter may have a rolloff of 30 dB or more per octave above the cutoff frequency, despite using fewer components and less area.

Figure 2:
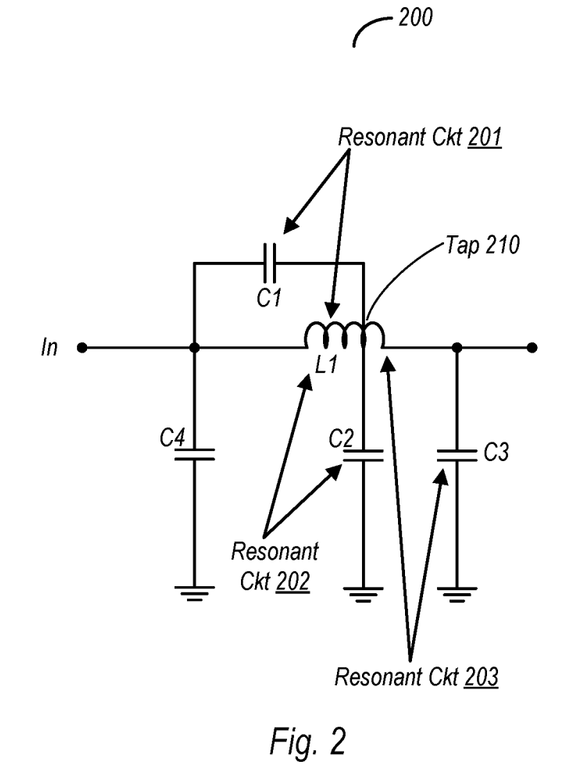
FIG. 2 is a schematic diagram of another embodiment of a filter circuit having a tapped inductor.

FIG. 2 is a schematic diagram of another embodiment of a single-ended passive filter. Filter 200 in the embodiment shown includes resonant circuit 201 (C1 and a portion of L1), resonant circuit 202 (C2 and a portion of L1) and resonant circuit 203 (C3 and a portion of L1). The embodiment shown also includes an impedance-matching capacitor C4. It is noted that, similar to the embodiment discussed above, any or all of the capacitors shown in FIG. 2 may be implemented as capacitor banks, and furthermore, the capacitance provided by these banks may be subject to tuning.

Whereas the embodiment shown in FIG. 1 shows C1 and C2 coupled to a center tap of L1, filter 200 as shown here shows C1 and C2 coupled to a different (non-center) tap point in inductor L1. Changing the tap point from the center of inductor L1 can alter the frequency response of filter 200. This results in a first portion of the inductor (left of the tap) having a first size and the second portion of inductor (right of the tap) having a second, different size. Accordingly, the frequency components attenuated by the first and second resonant circuits may be different relative to the embodiment shown in FIG. 1.

During operation of the embodiments of FIG. 2, current may flow either through C4 or through C1 and a portion of L1. The tap of inductor L1 may effectively create two inductors, with the inductance of each dependent on the actual tap point. The filter can be tuned in the embodiment shown by adjusting the capacitance of C1. Meanwhile, the value of C4 may be chosen to optimize a transfer function of the filter and to make the response as flat as possible. It is noted that the embodiment shown in FIG. 1 may also have a capacitor connected as C4 is shown in FIG. 2.

Figure 3:
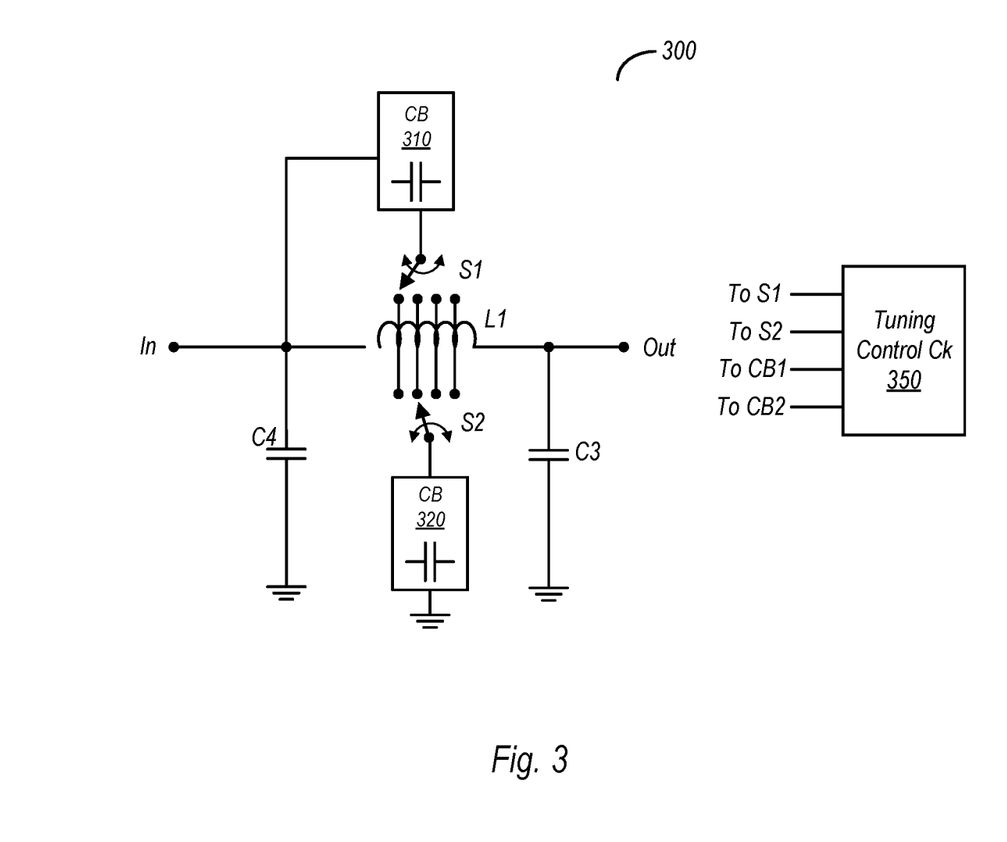
FIG. 3 is a schematic diagram of another embodiment of a filter circuit having a tapped inductor.

The present disclosure contemplates that the frequency response of various embodiments of the filter described herein can be changed during operation. FIG. 3 is a schematic diagram of another embodiment of a filter circuit having a tapped inductor. In the embodiment shown, filter 300 includes inductor L1, capacitors C3 and C4, and capacitor banks 310 and 320. Capacitors C3 and C4 may also be implemented as capacitor banks, but can be implemented as discrete capacitors as well. A switch S1 is coupled between capacitor bank 310 and various ones of the tap points on L1. Similarly, a switch S2 is coupled between capacitor bank 320 and various ones of the tap points on L1. A turning control circuit 350 is coupled to provide control signals to switches S1 and S2 and capacitance banks 310 and 320. Using these control signals, tuning control circuit can control the amount of capacitance provided by the capacitance banks 310 and 320, and can also control the amount of inductance that contributes to their corresponding resonant circuits. This may enable fine-tuning of the response of filter 300.

It is noted that in some embodiments, the response of filter 300 may be adjusted dynamically, during operation. In other embodiments, tuning control circuit may set the switches to their corresponding tap points and the capacitance banks to their respective values prior to operation. Furthermore, switches S1 and S2 may be set independently of one another in some embodiments, as may the respective capacitance values provided by capacitance banks 310 and 320. This in turn may allow the configuration shown to implement higher order filters than the similar embodiments that are non-configurable.

Figure 4:
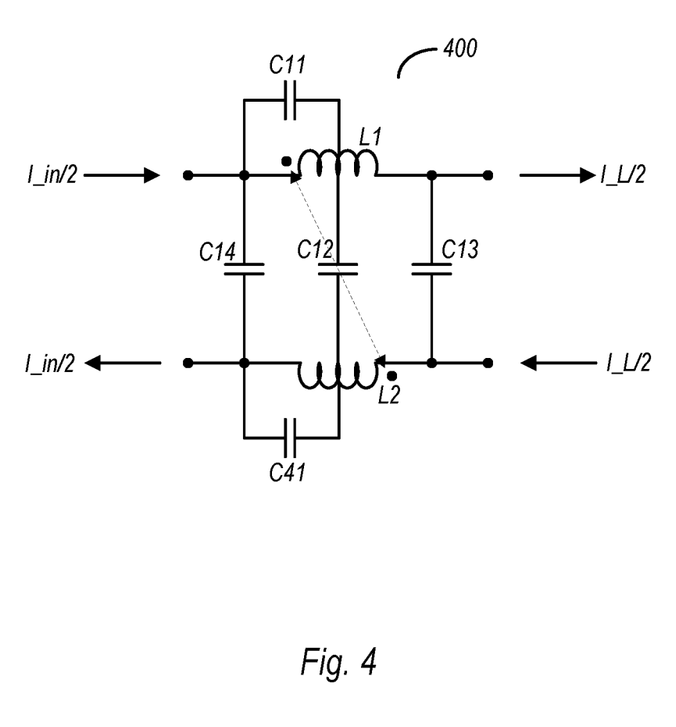
FIG. 4 is a schematic diagram of another embodiment of a filter circuit having a tapped inductor.

FIG. 4 is a schematic diagram of another embodiment of a filter circuit having a tapped inductor. In the embodiment shown, filter 400 is implemented as a differential filters, including two inductors, L1 and L2. The inductors of this embodiment are coupled inductors, and thus share the same magnetic core. One embodiment of such an inductor that may be used to implement filter 400 is discussed below in reference to FIG. 5.

Filter 400 includes capacitors C11 and inductor L1 in a first portion of the filter, while the second portion includes C41 and L2. Capacitors C12, C13, and C14 are coupled between the first and second portions of the circuit. Capacitor C12 is coupled to center taps of both inductor L1 and L2. It is noted that embodiments similar to those discussed above with reference to FIGS. 2 and 3 in which the capacitors are coupled to taps in the inductors at a point other than the center tap are possible and contemplated. Furthermore, embodiments such as FIG. 3 that include a tuning circuit that can set or change the particular point at which the inductors are tapped may also be incorporated into a differential filter such as that shown in FIG. 4. It is further noted that any or all of the capacitors may be implemented as capacitor banks rather than as discrete capacitors or capacitors having a fixed value.

The differential inductors L1 and L2 in the embodiment shown are embedded together to leverage the mutual magnetic coupling between the two inductors and to reduce the amount of chip area consumed. Furthermore, the tapped-in capacitive approach shown in FIG. 4 blocks the current at a certain band of resonance frequency, forcing the filter rolloff to go rapidly low. The additional arms utilizing the resonant circuit formed by inductors L1, L2 and C4 may attenuate the pass-through resonance by capacitor C13 and correspondingly coupled portions of L1 and L2. As previously noted, filter 400 can be generalized to add further tapping points inside the inductors and increase further the order of the filter.

Figure 5:
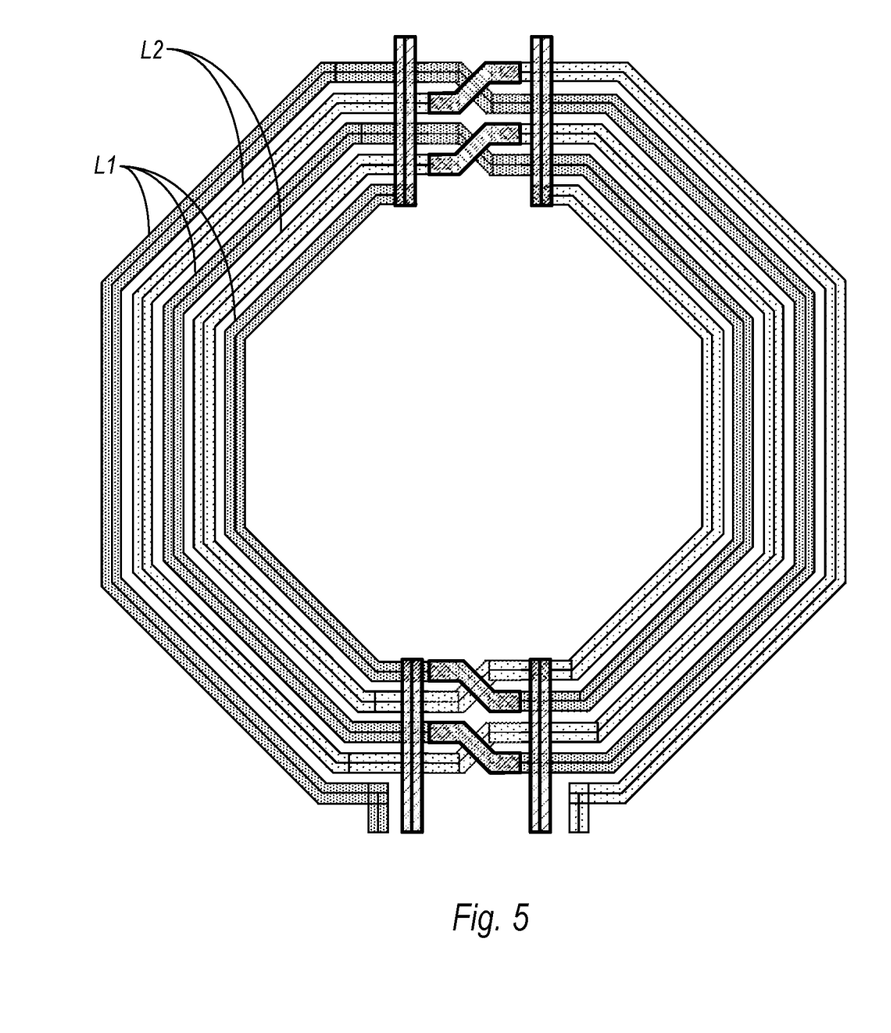
FIG. 5 is a diagram of one embodiment of a pair of intertwined inductors.

Inductor Arrangement:

FIG. 5 is a diagram illustrating one embodiment of intertwined inductors implemented on an integrated circuit die or substrate. In the embodiment shown, inductors L1 and L2 are intertwined with one another, with the two inductors distinguished from one another by the hatching shown in their respective portions. The various portions of the inductors may utilize different layers of metal to allow different portions to cross one another without connecting. The inductors may also be tapped on different layers of metal. In various embodiments of a filter utilizing inductors as shown in FIG. 5, the tap points may be inside the spiral on one or more of the different branches of each.

Figure 6:
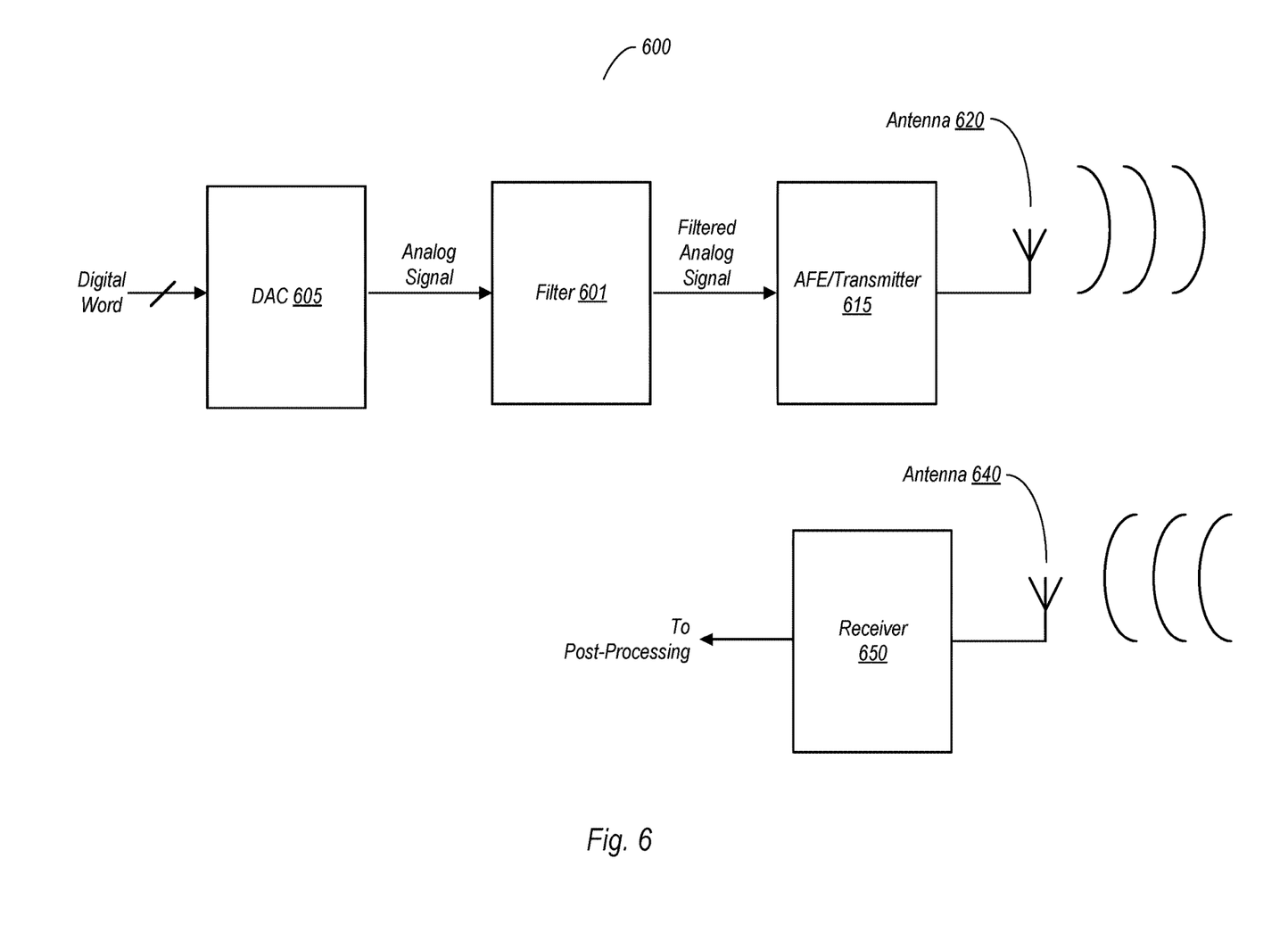
FIG. 6 is a diagram of one embodiment of a system utilizing a filter in accordance with the disclosure.

As inductors L1 and L2 are intertwined as shown here, they share a magnetic core and there is mutual magnetic coupling during operation. This arrangement thus allows for significant area savings Radio Frequency Sensing System:

FIG. 6 is a block diagram of one embodiment of a radio frequency (RF) sensing system that utilizes an embodiment of the filter as disclosed herein. RF sensing system 600 as shown in FIG. 6 may be used as a small radar system, sending out radio transmissions and then processing the reflections thereof to obtain data.

RF sensing system 600 in the embodiment shown includes a digital to analog converter (DAC) 605 that is coupled to receive a digital word. The digital word is converted into an analog signal by DAC 605 and provided to filter 601. Filter 601 in the embodiment shown is a filter having the first, second and third resonant circuits in accordance with the various embodiments discussed above. Furthermore, filter 601 may be a single-ended or differential filter. The filter may be implemented as a higher-order filter (e.g., $5^{th}$ order or higher) while using a minimal amount of circuit area, per the embodiments in this disclosure. Filter 601 outputs an filtered analog signal.

Analog front end (AFE)/transmitter 615 in the embodiment is configured to receive the analog filtered signal and perform various functions that conclude with the transmission of a corresponding radio signal. In one embodiment AFE/transmitter may include circuits such as low noise amplifiers, local oscillators, and so on. The filtered analog signal may, in some embodiments, be upconverted by circuitry implementing a direct conversion architecture or, alternatively, a heterodyne architecture. The radio signal may be transmitted via antenna 620.

On the receive side, reflected radio signals may be received by receiver 650 via antenna 640. Similar to transmitter 615, receiver 650 may include various circuits such as low noise amplifiers, local oscillators, and so on. Circuits for down-converting the received signal to a baseband signal may also be present in receiver 650. In one embodiment, an analog signal may be output from receiver 650 to various other circuits for post-processing. The present disclosure also contemplates that receiver 650 may include an analog-to-digital converter (ADC) to convert a received analog signal into a digital value for further post-processing.

It is noted that while some of the circuits discussed above may have been implemented using NMOS and PMOS transistors, the disclosure is not intended to limit embodiments falling within its scope to these types of devices. Thus, in addition to various MOSFET types discussed above, the present disclosure also contemplates embodiments that use non-planar devices such as FinFETs, GAAFETs (Gate All Around FETs), among other types. Embodiments implemented using Bipolar devices are also possible and contemplated. The disclosure further contemplates that technologies that are speculative as of this writing may be used to implement devices in various embodiments of the circuits discussed herein. These technologies include (but are not limited to) graphene transistors, carbon nanotube transistors, gallium arsenide transistors, and so on. The use of memristors in certain circuit structures is also contemplated.

Figure 7:
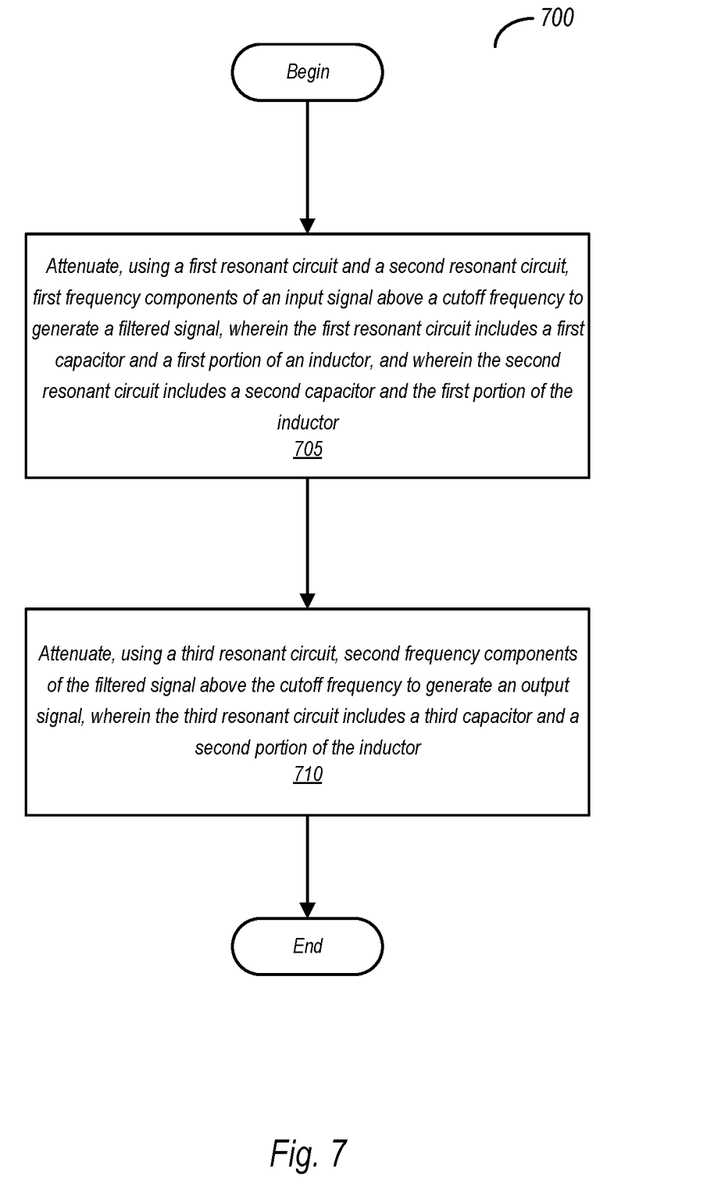
FIG. 7 is a flow diagram of one embodiment of a method for operating a filter.

Method for Operating a Passive Filter with Capacitive Inner Tapping:

FIG. 7 is a flow diagram of one embodiment of a method for operating a passive filter in accordance with this disclosure. Method 700 may be carried out by any of the filter embodiments discussed above, and may be utilized in a wide variety of applications. Embodiments of a passive filter capable of carrying out Method 700, but not explicitly disclosed herein, are nevertheless considered to fall within the scope of this disclosure.

Method 700 includes attenuating, using a first resonant circuit and a second resonant circuit, first frequency components of an input signal above a cutoff frequency to generate a filtered signal, wherein the first resonant circuit includes a first capacitor and a first portion of an inductor, and wherein the second resonant circuit includes a second capacitor and the first portion of the inductor (block 705). Method 700 further includes attenuating, using a third resonant circuit, second frequency components of the filtered signal above the cutoff frequency to generate an output signal, wherein the third resonant circuit includes a third capacitor and a second portion of the inductor (block 710).

In various embodiments, in the circuit used to carry out Method 700, the first capacitor is coupled in parallel with the first portion of the inductor. Similarly, in circuits that carry out Method 700, the second capacitor is coupled in series with the first portion of the inductor, the third capacitor is coupled in series with the second portion of the inductor, and a fourth capacitor is coupled between an input to the first resonant circuit and a ground supply node.

Method 700 may further include attenuating, using a fourth resonant circuit, third frequency components of the filtered signal above the cutoff frequency to generate the output signal. The fourth resonant circuit in an a filter arranged to carry out Method 700 includes a fourth capacitor and a third portion of the inductor.

Figure 8:
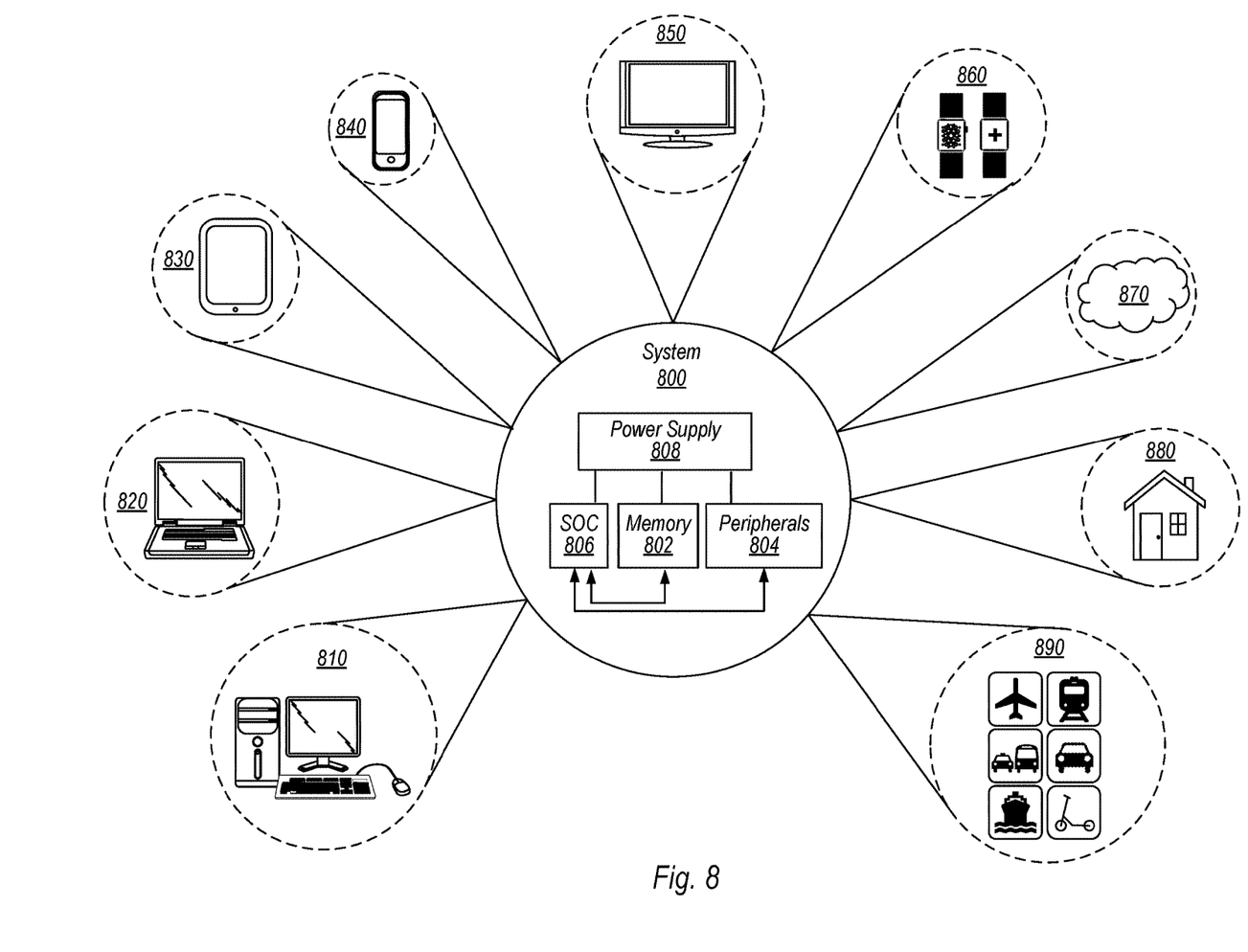
FIG. 8 is a block diagram of one embodiment of an example system.

Example System:

Turning next to FIG. 8, a block diagram of one embodiment of a system 800 is shown that may incorporate and/or otherwise utilize the methods and mechanisms described herein. In the illustrated embodiment, the system 800 includes at least one instance of a system on chip (SoC) 806 which may include multiple types of processing units, such as a central processing unit (CPU), a graphics processing unit (GPU), or otherwise, a communication fabric, and interfaces to memories and input/output devices. In some embodiments, one or more processors in SoC 806 includes multiple execution lanes and an instruction issue queue. In various embodiments, SoC 806 is coupled to external memory 802, peripherals 804, and power supply 808.

A power supply 808 is also provided which supplies the supply voltages to SoC 806 as well as one or more supply voltages to the memory 802 and/or the peripherals 804. In various embodiments, power supply 808 represents a battery (e.g., a rechargeable battery in a smart phone, laptop or tablet computer, or other device). In some embodiments, more than one instance of SoC 806 is included (and more than one external memory 802 is included as well).

The memory 802 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

System 800 in the embodiment shown may include one or more implementations of a passive filter as discussed above, either in SoC 806 or in peripherals 804. It is further contemplated that an embodiment of a radio system utilizing reflected radio transmissions such as that discussed in FIG. 6 may be implemented in system 800, e.g., in peripherals 800. The passive filter as discussed above may also be implemented in various other types of radio systems, some of which are briefly discussed in the following paragraph.

The peripherals 804 include any desired circuitry, depending on the type of system 800. For example, in one embodiment, peripherals 804 includes devices for various types of wireless communication, such as Wi-Fi, Bluetooth, cellular, global positioning system, etc. In some embodiments, the peripherals 804 also include additional storage, including RAM storage, solid state storage, or disk storage. The peripherals 804 include user interface devices such as a display screen, including touch display screens or multi-touch display screens, keyboard or other input devices, microphones, speakers, etc.

As illustrated, system 800 is shown to have application in a wide range of areas. For example, system 800 may be utilized as part of the chips, circuitry, components, etc., of a desktop computer 810, laptop computer 820, tablet computer 830, cellular or mobile phone 840, or television 850 (or set-top box coupled to a television). Also illustrated is a smartwatch and health monitoring device 860. In some embodiments, smartwatch 860 may include a variety of general-purpose computing related functions. For example, smartwatch 860 may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 800 may further be used as part of a cloud-based service(s) 870. For example, the previously mentioned devices, and/or other devices, may access computing resources in the cloud (i.e., remotely located hardware and/or software resources). Still further, system 800 may be utilized in one or more devices of a home other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 8 is the application of system 800 to various modes of transportation. For example, system 800 may be used in the control and/or entertainment systems of aircraft, trains, buses, cars for hire, private automobiles, waterborne vessels from private boats to cruise liners, scooters (for rent or owned), and so on. In various cases, system 800 may be used to provide automated guidance (e.g., self-driving vehicles), general systems control, and otherwise. These any many other embodiments are possible and are contemplated. It is noted that the devices and applications illustrated in FIG. 8 are illustrative only and are not intended to be limiting. Other devices are possible and are contemplated.

The present disclosure includes references to "an embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some tasks even if the structure is not currently being operated. Thus, an entity described or recited as being "configured to" perform some tasks refers to something physical, such as a device, circuit, a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

What is claimed is:
1. An apparatus comprising:
a filter circuit configured to attenuate frequency components in a differential input signal outside of a filter passband to generate a filtered differential signal, wherein the filter circuit includes;
 a first inductor coupled between a first input port and a first output port of the filter circuit;
 a second inductor coupled between a second input port and a second output port of the filter circuit, wherein the first and second inductors share a magnetic core;
 a first capacitance coupled between the first input port and a first tap point of the first inductor such that the first capacitance is in parallel with a first portion of the first inductor and in series with a second portion of the first inductor; and
 a second capacitance coupled between the second input port and a second tap point of the second inductor such that the second capacitance is in parallel with a first portion of the second inductor and in series with a second portion of the second inductor.

2. The apparatus of claim 1, wherein the first and second tap points are programmable, and wherein the apparatus further comprises a tuning control circuit configured to select the first and second tap points of the first and second inductors, respectively.

3. The apparatus of claim 2, wherein the first and second capacitances comprise first and second capacitor banks, and wherein the tuning control circuit is further configured to select an amount of capacitance coupled to the first and second tap points from the first and second capacitances.

4. The apparatus of claim 1, further comprising:
a third capacitance coupled between the first tap point and the second tap point; and
a fourth capacitance coupled between the first output port and the second output port.

5. The apparatus of claim 4, further comprising a fifth capacitance coupled between the first input port and the second input port.

6. The apparatus of claim 1, wherein the first and second inductors and first and second capacitances form first, second and third resonant circuits configured to attenuate the frequency components to generate the filtered differential signal.

7. The apparatus of claim 6, wherein the first and second resonant circuit are configured to attenuate first frequency components outside of the filter passband.

8. The apparatus of claim 7, wherein the third resonant circuit is configured to attenuate second frequency components outside of the filter passband.

9. The apparatus of claim 1, wherein respective first portions of the first and second inductors have a first size and wherein respective second portions of the first and second inductors have a second size, and wherein the first and second sizes are different.

10. The apparatus of claim 1, wherein the filter circuit implements a filter having an order that is $2^{nd}$ order or greater.

11. A method comprising:
attenuating, using a filter circuit, frequency components outside of a filter passband present in a differential input signal, wherein the attenuating includes:
inputting a first component of the differential input signal, via a first input port, into a first inductor coupled between the first input port and a first output port;
inputting a second component of the differential input signal, via a second input port, into a second inductor coupled between the second input port and a second output port;
attenuating at least a portion of the frequency components from the first component of the differential input signal using a first resonant circuit including a first capacitance coupled between the first input port and a first tap point of the first inductor such that the first capacitance is in parallel with a first portion of the first inductor and in series with a second portion of the first inductor;
attenuating at least a portion of the frequency components from the second component of the differential input signal using a second capacitance coupled between the second input port and a second tap point of the second inductor such that the second capacitance is in parallel with a first portion of the second inductor and in series with a second portion of the second inductor; and
outputting first and second components of a filtered differential signal from the first and second output ports, respectively.

12. The method of claim 11, wherein the first and second tap points are programmable, and wherein the method further comprises a control circuit selecting the first and second tap points of the first and second inductors, respectively.

13. The method of claim 12, wherein the first and second capacitances comprise first and second capacitor banks, and wherein the method further comprises the control circuit selecting respective amounts of capacitance provided by the first and second capacitor banks.

14. The method of claim 11, further comprising attenuating first frequency components of the differential input signal using first and second resonant circuits formed using the first and second inductors, respectively, and the first and second capacitances, respectively.

15. The method of claim 14, further comprising attenuating second frequency components of the differential input signal using a second resonant circuit formed using the first and second inductors and a third capacitance coupled between the first and second tap points.

16. A system comprising:
a digital-to-analog converter (DAC) configured to output an analog signal based on a digital word;
a filter circuit configured to generate a filtered signal based on the analog signal, wherein the filter circuit includes:
a first inductor coupled between a first input port and a first output port of the filter circuit; and
a first capacitance coupled between the first input port and a first tap point of the first inductor such that the first capacitance is in parallel with a first portion of the first inductor and in series with a second portion of the first inductor, wherein the filter circuit is further configured to output at least a portion of the filtered signal on the first output port; and
a transmitter circuit configured to generate and transmit a radio frequency signal based on the filtered signal.

17. The system of claim 16, further comprising:
a second inductor coupled between a second input port and a second output port of the filter circuit, wherein the first and second inductors share a magnetic core;
a second capacitance coupled between the second input port and a second tap point of the second inductor such that the second capacitance is in parallel with a first portion of the second inductor and in series with a second portion of the second inductor;
a third capacitance coupled between the first tap point and the second tap point;
a fourth capacitance coupled between the first output port and the second output port; and
a fifth capacitance coupled between the first input port and the second input port.

18. The system of claim 17, further comprising a tuning control circuit configured to:
select the first and second tap points of the first and second inductors, respectively; and
select first and second amounts of capacitance, from the first and second capacitances, respectively, coupled to the first and second tap points, respectively.

19. The system of claim 17, wherein respective first portions of the first and second inductors have a first size and wherein respective second portions of the first and second inductors have a second size, and wherein the first and second sizes are different.

20. The system of claim 17, wherein the first and second inductors and first and second capacitances form first, second and third resonant circuits configured to attenuate frequency components of the analog signal to generate the filtered signal, wherein the analog signal is a differential signal, wherein the first and second resonant circuits are configured to attenuate first frequency components outside of a filter passband, and wherein the third resonant circuit is configured to attenuate second frequency components outside of the filter passband.

* * * * *

UNITED STATES PATENT AND TRADEMARK OFFICE
CERTIFICATE OF CORRECTION

| | |
|---|---|
| PATENT NO. | : 12,009,796 B2 |
| APPLICATION NO. | : 18/461303 |
| DATED | : June 11, 2024 |
| INVENTOR(S) | : Ahmed F. Aref Mahmoud |

It is certified that error appears in the above-identified patent and that said Letters Patent is hereby corrected as shown below:

In the Specification

Column 7, Line 15, delete "800;" and insert --804--.

Signed and Sealed this
Third Day of September, 2024

Katherine Kelly Vidal
*Director of the United States Patent and Trademark Office*